(12) United States Patent
Dickover et al.

(10) Patent No.: US 10,170,391 B2
(45) Date of Patent: Jan. 1, 2019

(54) BACKSIDE INITIATED UNIFORM HEAT SINK LOADING

(71) Applicant: Lenovo Enterprise Solutions (Singapore) Pte. Ltd., Singapore (SG)

(72) Inventors: Scott W. Dickover, Raleigh, NC (US); Brian M. Kerrigan, Cary, NC (US); Timothy A. Meserth, Durham, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 131 days.

(21) Appl. No.: 14/274,191

(22) Filed: May 9, 2014

(65) Prior Publication Data

US 2015/0327353 A1    Nov. 12, 2015

(51) Int. Cl.
| | |
|---|---|
| *H01L 23/40* | (2006.01) |
| *H05K 1/02* | (2006.01) |
| *H05K 7/20* | (2006.01) |
| *B23P 15/26* | (2006.01) |
| *H01L 23/433* | (2006.01) |

(52) U.S. Cl.
CPC .......... *H01L 23/4006* (2013.01); *B23P 15/26* (2013.01); *H01L 23/4338* (2013.01); *H05K 1/0203* (2013.01); *H05K 7/2039* (2013.01); H01L 2023/4087 (2013.01); H01L 2924/0002 (2013.01); Y10T 29/49352 (2015.01)

(58) Field of Classification Search
CPC .. H05K 1/0203; H05K 7/2039; H05K 9/0016; H05K 7/1038

USPC .... 361/679.54, 96, 697, 701, 702, 703, 704, 361/707, 709, 710, 711, 712, 715, 716, 361/720, 722, 723

See application file for complete search history.

(56) References Cited

U.S. PATENT DOCUMENTS

| | | |
|---|---|---|
| 5,734,556 A | 3/1998 | Saneinejad et al. |
| 5,903,434 A | 5/1999 | Chiou |
| 6,008,990 A | 12/1999 | Liu |
| 6,141,220 A | 10/2000 | Lin |

(Continued)

FOREIGN PATENT DOCUMENTS

KR    1020030071118 A    9/2003

*Primary Examiner* — Robert J Hoffberg
(74) *Attorney, Agent, or Firm* — Jason Friday; Andrew M. Calderon; Roberts Mlotkowski Safran Cole & Calderon, P.C.

(57) ABSTRACT

A backside initiated uniform heat sink loading system includes a system board assembly, a heat sink assembly, a loading plate, and a fastener. The system board assembly includes at least one processing unit. The heat sink assembly is mounted upon the processing unit from a topside of the system board assembly and includes a plurality of tension members that extend through the system board assembly. The loading plate is mounted to the plurality of tension members from a backside of the system board assembly. The fastener engages with the loading plate from the backside and forces the loading plate away from the system board assembly. As a result, the tension members uniformly force the heat sink assembly upon the processing unit to seat the processing unit with the system board assembly and to thermally contact the heat sink assembly with the processing unit.

20 Claims, 4 Drawing Sheets

(56) References Cited

U.S. PATENT DOCUMENTS

| | | | | |
|---|---|---|---|---|
| 6,330,745 B1 * | 12/2001 | Cromwell | H01L 23/3675 | 174/541 |
| 6,386,890 B1 * | 5/2002 | Bhatt | H05K 3/325 | 439/66 |
| 6,475,011 B1 * | 11/2002 | Sinha | H01R 43/205 | 439/330 |
| 6,545,879 B1 * | 4/2003 | Goodwin | H05K 7/1053 | 361/688 |
| 6,611,431 B1 * | 8/2003 | Lee | H01L 23/4006 | 257/719 |
| 6,654,250 B1 * | 11/2003 | Alcoe | H05K 1/189 | 257/719 |
| 6,724,632 B2 | 4/2004 | Lee et al. | | |
| 6,731,506 B1 | 5/2004 | Dong et al. | | |
| 6,743,026 B1 * | 6/2004 | Brodsky | H05K 3/325 | 361/719 |
| 6,802,733 B2 * | 10/2004 | Colbert | H05K 7/1061 | 439/331 |
| 6,826,054 B2 | 11/2004 | Liu | | |
| 6,929,484 B2 * | 8/2005 | Weiss | H01R 13/2414 | 439/66 |
| 6,968,889 B2 * | 11/2005 | Wang | H01L 23/4006 | 165/185 |
| 7,077,659 B2 * | 7/2006 | Weiss | H01R 13/2414 | 439/66 |
| 7,095,614 B2 * | 8/2006 | Goldmann | H01L 23/4006 | 165/185 |
| 7,133,285 B2 * | 11/2006 | Nishimura | H05K 5/0265 | 165/185 |
| 7,142,427 B2 * | 11/2006 | Reents | H01L 23/4093 | 165/185 |
| 7,190,591 B2 | 3/2007 | Peng et al. | | |
| 7,209,354 B2 * | 4/2007 | Wu | H01L 23/4093 | 257/706 |
| 7,249,954 B2 * | 7/2007 | Weiss | H01R 13/2414 | 439/66 |
| 7,275,939 B2 * | 10/2007 | Byquist | H01L 24/72 | 257/E23.078 |
| 7,391,617 B2 * | 6/2008 | Veh | G06F 1/20 | 165/104.33 |
| 7,399,185 B2 * | 7/2008 | Colbert | H05K 3/325 | 257/E23.084 |
| 7,428,154 B2 * | 9/2008 | Ishimine | H01L 23/4006 | 165/185 |
| 7,443,026 B2 * | 10/2008 | Goldmann | H05K 1/0271 | 257/718 |
| 7,486,516 B2 * | 2/2009 | Colbert | H01L 23/4006 | 257/718 |
| 7,517,230 B2 * | 4/2009 | Colbert | H05K 3/325 | 439/73 |
| 7,536,781 B2 * | 5/2009 | Cromwell | H01L 23/4006 | 29/739 |
| 7,558,066 B2 * | 7/2009 | Eckberg | H01L 23/4006 | 165/104.33 |
| 7,583,504 B2 * | 9/2009 | Aberg | H01L 23/4006 | 165/80.3 |
| 7,697,296 B2 * | 4/2010 | Floyd | H01L 23/4093 | 165/80.3 |
| 7,765,693 B2 * | 8/2010 | Brodsky | H01R 13/2407 | 29/854 |
| 7,795,724 B2 * | 9/2010 | Brodsky | H01L 23/3121 | 257/712 |
| 7,957,148 B1 * | 6/2011 | Gallarelli | H01L 23/32 | 165/80.3 |
| 7,990,722 B2 * | 8/2011 | Cao | H01L 23/4006 | 165/185 |
| 8,520,393 B2 * | 8/2013 | Homer | G06F 1/20 | 165/122 |
| 8,867,211 B2 * | 10/2014 | Wiltzius | H01L 23/4006 | 165/80.3 |
| 2002/0093789 A1 * | 7/2002 | Sloan | H01L 23/4093 | 361/679.54 |
| 2004/0084764 A1 * | 5/2004 | Ishimine | H01L 23/4006 | 257/706 |
| 2006/0202325 A1 * | 9/2006 | Coico | H01L 23/4006 | 257/718 |
| 2008/0266808 A1 * | 10/2008 | Aberg | H01L 23/4006 | 361/709 |
| 2008/0310118 A1 * | 12/2008 | Brocklesby | F16B 5/0208 | 361/719 |
| 2009/0057865 A1 * | 3/2009 | Brodsky | H01L 23/3121 | 257/687 |
| 2009/0163068 A1 * | 6/2009 | yeh | H01R 12/88 | 439/331 |
| 2012/0218712 A1 * | 8/2012 | Hayashi | H05K 7/2049 | 361/704 |
| 2013/0083504 A1 * | 4/2013 | Fukuzono | H01L 23/4006 | 361/783 |
| 2013/0206380 A1 * | 8/2013 | Chang | H01L 23/3672 | 165/185 |
| 2014/0174695 A1 * | 6/2014 | Wang | F16B 41/002 | 165/76 |

* cited by examiner

BACKSIDE INITIATED UNIFORM HEAT SINK LOADING

FIELD

Embodiments of invention generally relate to the heat removal systems and heat removal components utilized in electronic systems, and more particularly to backside initiated uniform heat sink loading.

DESCRIPTION OF THE RELATED ART

Data handling processors (central processing unit, graphics processing unit, general processing unit, etc.) often require significant compression forces to ensure proper seating of the pins of the processor with the pads of a connector, such as a Land Grid Array socket. Further, such processors also produce significant heat that must be removed to ensure continual operation. A cost effective cooling solution involves a heat sink that is compressed directly to the top surface of the processor utilizing a mechanical advantage to provide the large compression force.

SUMMARY

In a first embodiment of the present invention, a backside initiated uniform heat sink loading system includes a system board assembly that includes at least a processing unit; a heat sink assembly mounted upon the processing unit from a topside, the heat sink assembly including a plurality of tension members that extend through the system board assembly; a loading plate mounted to the plurality of tension members from a backside; and a fastener that engages with the loading plate from the backside. In certain embodiments, the fastener forces the loading plate away from the system board assembly and the plurality of tension members uniformly force the heat sink assembly upon the processing unit.

In another embodiment of the present invention, an electronic device includes the system board assembly; the heat sink assembly mounted upon the processing unit; the loading plate mounted to the plurality of tension members; and the fastener that engages with the loading plate.

In another embodiment, a uniform backside heat sink loading method includes mounting a heat sink assembly to a processing unit from a topside of a system board assembly; installing a plurality of tension members to the heat sink assembly and through the system board assembly from the top side; connecting a loading plate to the plurality of tension members from a backside of the system board assembly, and; engaging a fastener to the contact plate from the backside to force the loading plate away from the system board assembly.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Details of the claimed embodiments are disclosed herein. However, it is understood that the disclosed embodiments are merely illustrative of the structures, devices, systems, methods, etc. that may be embodied in various forms. These exemplary embodiments are provided so that this disclosure will be thorough and complete and will convey the scope of this invention to those skilled in the art. In the description, details of well-known features and techniques may be omitted to avoid unnecessarily obscuring the presented embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

Figure 1:
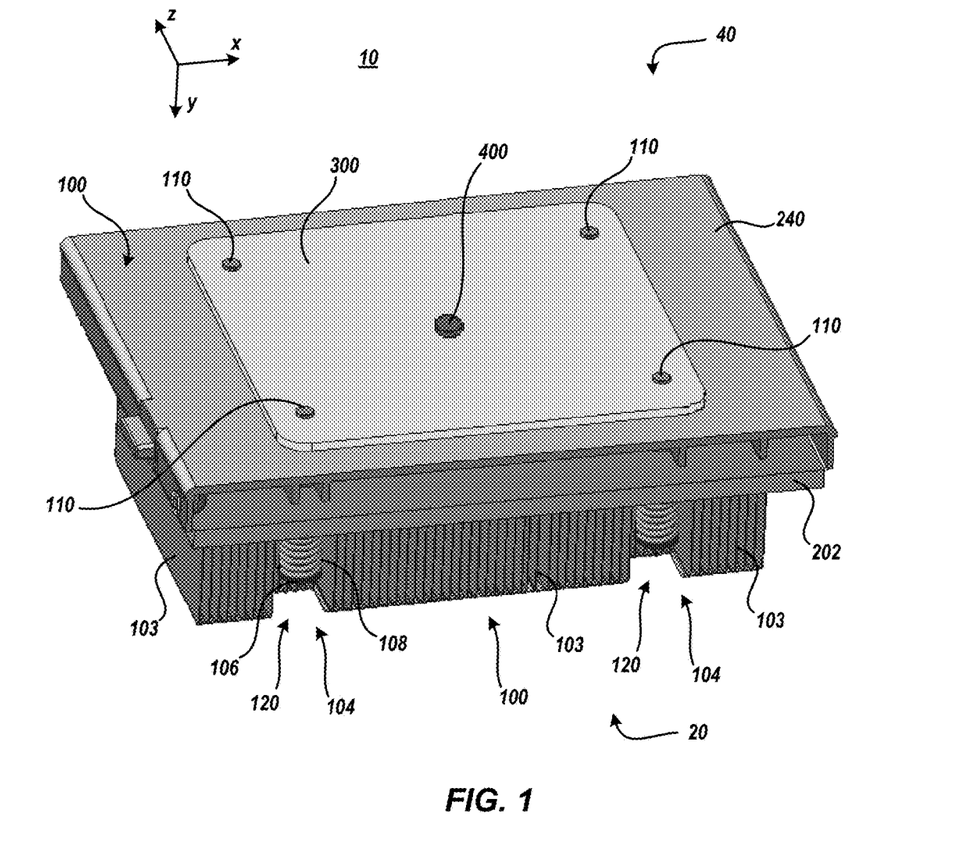
FIG. 1-FIG. 3 depict a backside initiated uniform heat sink loading system according to various embodiments of the present invention.
Figure 2:
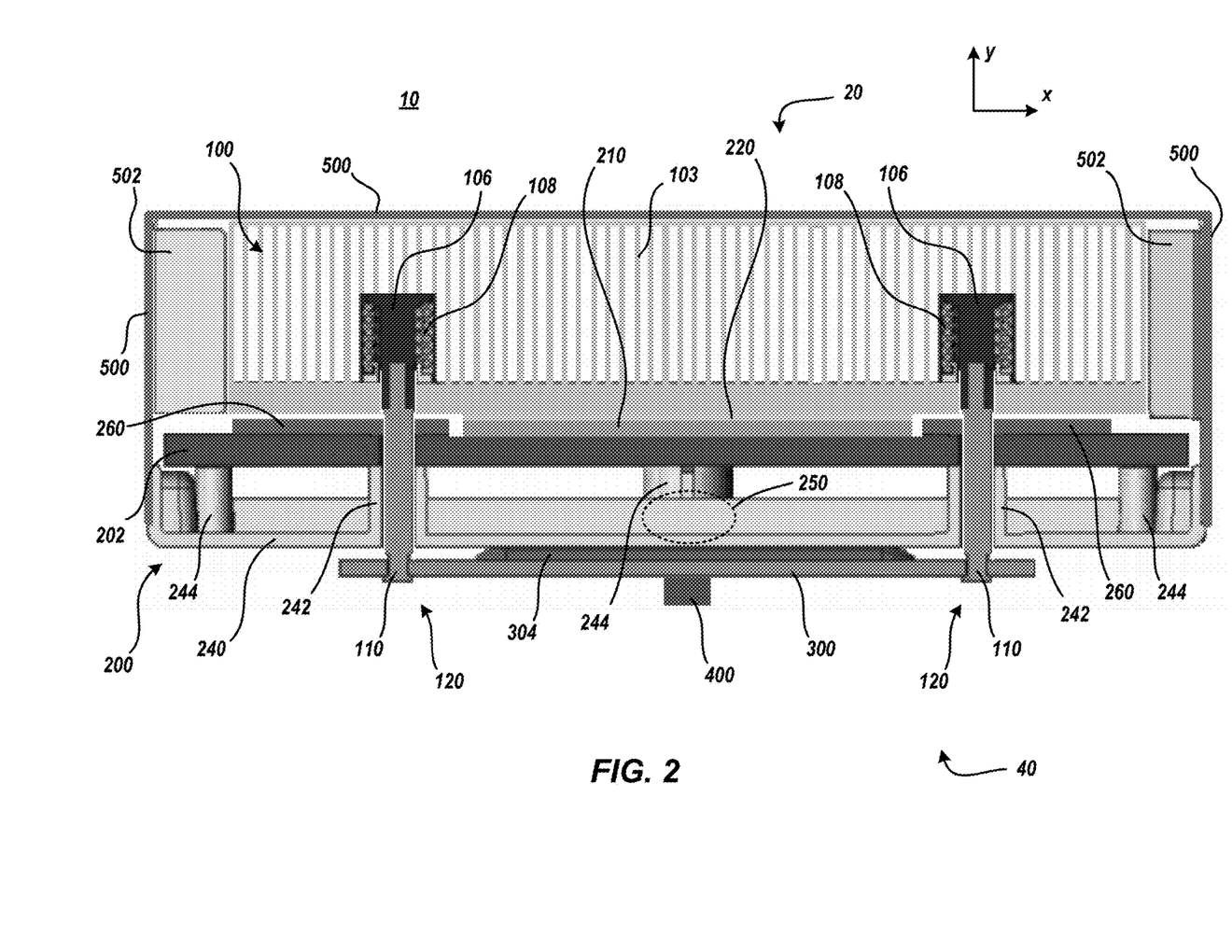
Figure 3:
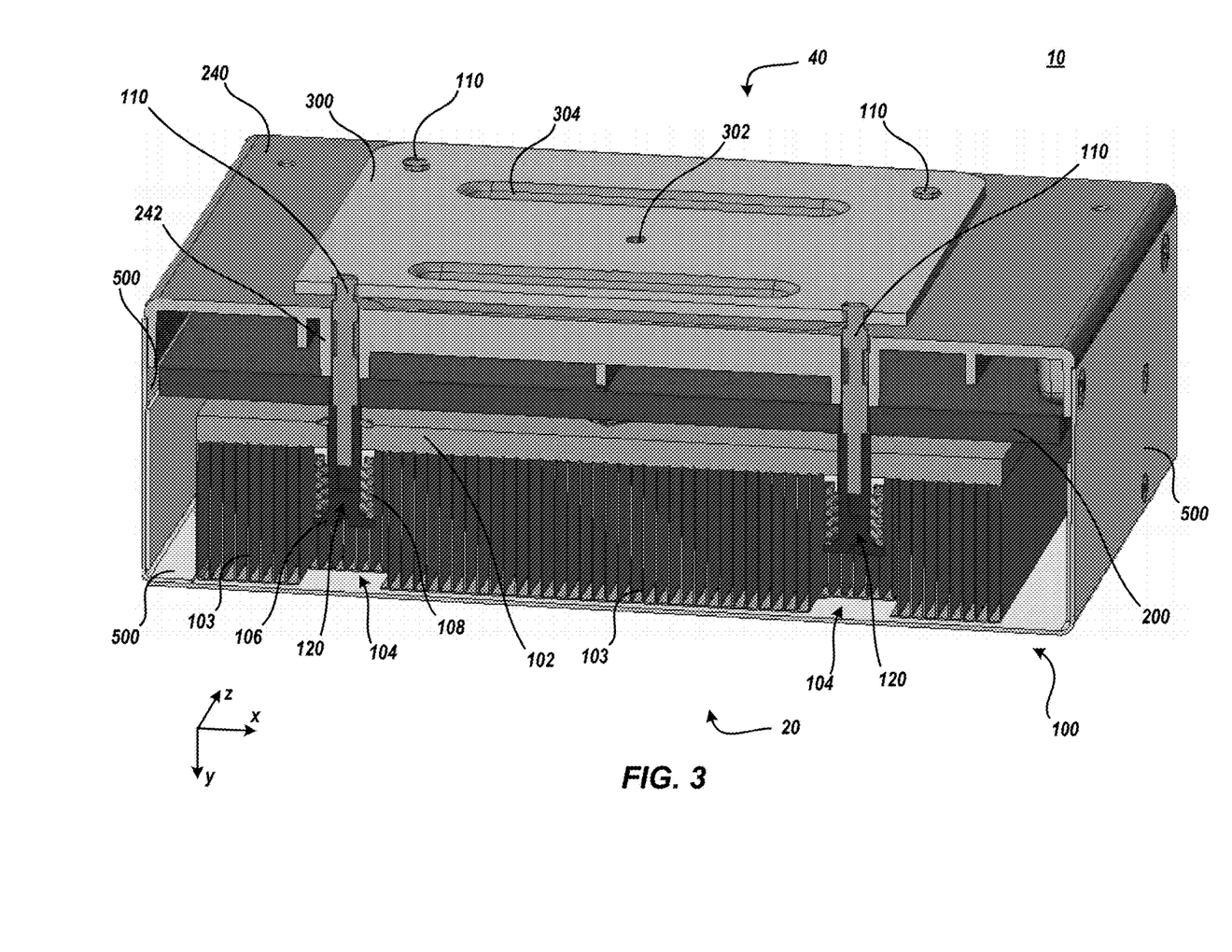

Referring simultaneously to FIG. 1-FIG. 3 that depict various embodiments of a uniform backside heat sink loading system 10. In these various embodiments, the backside initiated uniform heat sink loading system 10 may be utilized by a data handling system, electronic enclosure, etc. (a non exhaustive list) such as a telecommunication system, computer system, power distribution system, radar system, electronic music system, automated teller machine.

In an embodiment, backside initiated uniform heat sink loading system 10 includes a heat sink assembly 100, a system board assembly 200 that includes at least a processing unit 210, a loading plate 300, and a fastener 400. The heat sink assembly 100 may be engaged or otherwise connected to the system board assembly 200 from a topside 20 of the backside initiated uniform heat sink loading system 10. The loading plate 300 may be engaged or otherwise connected to the heat sink assembly 100 from a backside 40 of the backside initiated heat sink loading system 10. Fastener 400 may also be engaged or otherwise connected to the loading plate 300 from the backside 40. Uniform heat sink loading may be initiated by engaging fastener 400 from the backside 40 so as to force loading plate 300 away from system board assembly 200 and to provide a uniform loading force between heat sink assembly 100 and system board assembly 200. The loading force may provide for both the seating of processing unit 210 and to ensure thermal contact between the processing unit 210 and heat sink assembly 100.

In various embodiments, heat sink assembly 100 includes base 102, a plurality of fins 103, a plurality of recesses 104, a plurality of tension members 120, and/or a plurality of compression springs 108.

Base 102 may be a heat exchanger that moves heat between processing unit 210 and a secondary heat exchanger, such as fins 103, with a greater surface area than the processing unit 210. In certain embodiments, base 102 may be a plate of copper, aluminum, alloy, or other material with similar or greater thermal conductivity. Generally, base 102 transfers heat so that the secondary heat exchanger may be more efficiently utilized. In certain embodiments, the secondary heat exchanger is a plurality of fins 103. Fins 103 may also be composed of a heat conductive material such as copper, aluminum, alloy, etc. In some embodiments, the combination of base 102 and fins 103 may form a heat sink. In other embodiments, the heat sink may also include heat pipes, vapor chamber, etc. to increase heat transfer efficiency. Fins 103 may be pins that extend from base 102. The pins can be cylindrical, elliptical or square. Fins 103 may also be parallel fins that generally extend the entire length of base 102. Fins 103 may also be flared fins that are not parallel that generally extends the entire length of base 102. Recesses 104 are areas of base 102 where fins 103 are not present. In certain embodiments, there may be four recesses 104 located generally at respective corners of base 102. Further, within recesses 104 there may also be a base 102 through-hole so that a respective tension member 120 may extend therethrough. In certain embodiments, the underside of base 102 may includes a pedestal. The pedestal is generally a protrusion from base 102 and may serve as an area to contact processing element 210, thermal interface material 220, etc. In certain embodiments, the pedestal may be machined from base 102. The pedestal may be utilized to ensure a flat surface may be in contact with processing element 210, thermal interface material 220, etc.

A tension member 120 may include a topside flare 106 and an elongated segment 110. Flare 106 generally has upper portion and a lower portion. The upper portion has a dimension (width, circumference, etc.) that is greater than a dimension of the lower portion so that the upper portion of the topside flare 106 may contact another component of heat sink assembly 100. For example, the upper portion of topside flare 106 may contact an upper surface of the base 102 while the lower portion of topside flare 106 may extend through the base 102 through-hole. Elongated segment 110 may be engaged with topside flare 106 and may extend through system board assembly 200. Therefore, in order to extend through system board assembly 200 the elongated segment 110 is generally taller than it is wide. In certain embodiments, tension member 120 engages with the heat sink from top side 20. In such embodiments, topside flare 106 and elongated segment 110 are generally integrated and inserted into a base 102 through-hole from top side 20. In other embodiments, topside flare 106 engages with the heat sink from top side 20 while elongated segment 120 engages with topside flare 106 from the backside 40. For example, topside flare 106 may be inserted into the base 102 through-hole from top side 20 and the elongated segment 120 may snap, screw, fasten, etc. into topside flare 106 from the backside 40. In certain embodiments, elongated segment 110 includes a collar to retain tension member 120 to base 102. For example the upper portion of flare 106 may contact the upper surface of base 102 to prevent movement of tension member 120 in the y direction, the collar may contact a lower surface of base to prevent movement of tension member 120 in the +y direction, and the base 102 through hole prevents movement of tension member 120 in the z direction. In certain embodiments, tension member 120 may be elongated segment 110 that directly engages (e.g. screw, fasten, etc.) into base 102.

Compression springs 108 are configured to operate with a compression load, such that the spring compression springs 108 gets shorter as the load is applied. Compression springs 108 may be aligned to the through hole of base 102 and may be retained to heat sink assembly 100 by a spring retainer. Springs 108 may be chosen to provide desired compression in association with the force applied to processing unit 210 by heat sink assembly 100 when fastener 400 is engaged from backside 40. In certain embodiments, the upper portion of flares 106 may contact the upper surfaces of compression springs 108, as is depicted in e.g. FIG. 2. In such embodiments, the compression springs 108 provide for a normalized or a uniform compression force across the bottom surface of base 102 upon processing unit 210 even though a tension member 120 may be slightly longer than other tension members 120 (e.g. due to manufacturing tolerances, etc.).

System board assembly 200 may include a system board 202, processing unit 210, thermal interface 220, lower chassis 240, and/or topside stiffener 260.

System board 202 may be a system board, mother board, etc. that is a printed circuit board and holds many of the crucial electronic components of the electronic system, such as the processing unit 210, memory modules, etc. and may provide connectors for electronic system peripherals. The system board 202 provides electrical connections by which components of the electronic system communicate. The system board 202 may include one or more sockets in which one or more processing units 210 may be installed, respectively and may include other connectors into which e.g. memory modules may be installed. System board 202 may also include a chipset which forms an interface between the processing unit 210, memory, etc., non volatile memory containing the system's firmware or BIOS, a clock to synchronize the various components, slots for expansion cards, power supply connectors, etc. In certain embodiments, System board assembly 200 may also include other components attached the system board 202, such as e.g., video cards, network cards, hard drives, or other forms of persistent storage, television tuner cards, cards providing extra input output slots and a variety of other components.

Processing unit 210 is the hardware within the electronic system that carries out the instructions of a program by performing the basic arithmetical, logical, and input/output operations. The electronic system may include multiple processing units 210. In certain embodiments each processing unit 210 may be associated with a particular heat sink assembly 100. In other embodiments, multiple processing units may be associated with a particular heat sink assembly 100. In some embodiments, processing unit 210 may contain multiple processing units on a single chip, such as a multi-core processor. In some embodiments processing unit 210 can also contain peripheral devices, and other components of the electronic system, such as a system on a chip. The processing unit 210 may contain an arithmetic logic unit that performs arithmetic and logical operations and a control unit that evokes the program from memory. The processing unit 210 also includes a pin grid array. In certain embodiments, the pins of the pin grid array are arranged in a regular array on the backside 40 of the processing unit 210. The pins may or may not cover the entire backside 40 of the processing unit 210. The pin grid array may be mounted to the socket of the system board 202. In certain embodiments, processing unit 210 includes a heat spreader cap. The heat spreader cap may serve as a flat surface to contact heat sink assembly 100. Further, the heat spreader cap may protect the processors, chips, etc. of processing unit 210.

The socket of the system board 202 is a mechanical component(s) that provides mechanical and electrical connections between the processing unit 210 and the system board 202. The socket allows the processing unit 210 to be replaced without solder. The socket may be a land grid array (LGA) socket. A threshold insertion force is needed to seat the pin grid array of the processing unit 210 with the socket.

Thermal interface material 220 may be a thermal grease, thermal gel, thermal compound, thermal paste, heat paste, heat sink paste, thermal interface material, heat sink compound, etc. and may be a viscous fluid that increases the thermal conductivity of a thermal interface between heat sink assembly 100 and processing unit 210 by filling microscopic air-gaps present due to the imperfectly flat and smooth surfaces of the components (e.g. the underside of base 102, etc). In certain embodiments, thermal interface material 220 is utilized to thermally contact the heat sink assembly 100 with the processing unit 210. In certain embodiments, the thermal interface material 220 is utilized to thermally contact the pedestal of the base of the heat sink assembly 100 with the heat spreader cap of the processing unit 210.

Lower chassis 240 may consist of a metal frame on which system board 102 may be mounted. For example, lower chassis 240 may be a sheet metal frame on to which system board 102 affixed. Lower chassis 240 may protect the internal equipment from dust, moisture, and tampering and generally provides a lower perimeter or exterior surface. In certain embodiments, the lower perimeter or exterior surface is an exterior surface of the electronic system. Lower chassis 240 may include attachment features, such as a flange, to which an upper chassis 500 may be connected. Lower chassis 240 may include a plurality of though-hole stand offs 242 and a plurality of through-hole threaded standoffs 244. Upper surfaces of though-hole stand offs 242 and a plurality of through-hole standoffs 244 are co-planar and provide a contact surface for the attachment of system board 202 to lower chassis 240. Screws, pins, fasteners, etc. engaged from topside 20 may generally fix system board 202 to through-hole threaded standoffs 244. Tension members 120 may extend through though-hole stand offs 242. Topside stiffener 260 is a plate around the perimeter of processing unit 210 upon the topside 20 of system board 202 that prevents system board 202 from warping during loading of the heat assembly 100 upon processing unit 210. Topside stiffener 260 may be positioned generally underneath heat sink assembly 100 or positioned outside of the heat sink assembly 100. In certain embodiments, topside stiffener 260 includes a plurality of through holes so that tension members 120 may extend therethrough. In certain embodiments, lower chassis 240 may include a stiffening feature 250 generally aligned with fastener 400 to prevent lower chassis 240 from substantial warping, deflection, etc.

In various embodiments, during operation of the electronic system, heat is generated by processing unit 210 and is transferred to heat sink assembly 100 by e.g. thermal interface material 220. Heat generated from processing unit 210 flows to base 102 and subsequently to the secondary heat exchanger such as fins 103. The secondary heat exchanger dissipates the heat thereby cooling the electronic system. For example, the high thermal conductivity of fins 103 combined with a relatively large surface area (compared to base 102) result in a transfer of thermal energy to the surrounding, cooler, air. In certain embodiments, the electronic system may also include an active fluid moving device, such as a fan that may force cooler air across the secondary heat exchanger to increase the transfer of thermal energy. In an embodiment, upper chassis 500 includes one or more air baffles 502 that force the cooler air across fins 103.

In various embodiments a plurality of tunnels are formed by an alignment of various through-holes of system board assembly 200. For example, through-holes of the system board 202 may align with through-holes of though-hole stand offs 242 to form the plurality of tunnels. In some embodiments including the topside stiffener 260, through-holes of the topside stiffener 260, through-holes of the system board 202, and through-holes of though-hole stand offs 242 may align to form the plurality of tunnels. The plurality of tunnels allow tension members 120 to extend through system board assembly 200.

Loading plate 300 is a stiff plate and may be, for example, a sheet metal plate. Loading plate 300 may include stiffing features such as ribs, embosses 304 that further stiffen loading plate 300 such that loading plate 300 does not substantially warp, deflect, etc. Loading plate 300 includes a clearance hole 302 that accepts fastener 400. In certain embodiments, clearance hole 302 may be threaded. Loading plate 300 also includes tension member through-holes that accept tension members 120, respectively. In certain embodiments, tension member through-holes are aligned key-hole through holes with a first portion to accept an outer diameter of tension member 120 and a second diameter portion to accept an inner diameter of tension member 120.

In an embodiment, heat sink assembly 100 may be engaged or otherwise loaded onto the processing unit 210 of the system board assembly 200 from the topside 20. The loading plate 300 may be engaged or otherwise connected to tension members 120 from backside 40. Fastener 400 may also be engaged the loading plate 300 from backside 40. The fastener 400 contacts a bottom surface of lower chassis 240. Further engagement of fastener 400 to the loading plate 300 then forces loading plate 300 away from the system board assembly 200. In a particular embodiment, the fastener may be a left turn to tighten screw and clearance hole 302 includes associated threads. When loading plate 300 is forced away (e.g. the −y direction) from and relative to system board assembly 200. As a result, tension members 120 compress compression springs 108 and force heat sink assembly 100 into processing unit 210. In this manner, the backside 40 engagement of fastener 400 provides a uniform loading force to processing unit 210 such that pin grid array may seat or otherwise connect with the socket of system board assembly 200. The uniform loading also provides for thermal contact between the processing unit 210 and heat sink assembly 100 via thermal interface material 220.

In various embodiments, the upper chassis 500 and the lower chassis 240 form an exterior perimeter of the data handling system, electronic enclosure, etc. In other embodiments, the upper chassis 500 and the lower chassis 240 form an exterior perimeter of a data handling module that may be inserted into or otherwise connected with the data handling system, electronic enclosure, etc. In other words, backside initiated uniform heat sink loading system 10 may form the data handling system itself or backside initiated uniform heat sink loading system 10 may be a component of the data handling system.

Figure 4:
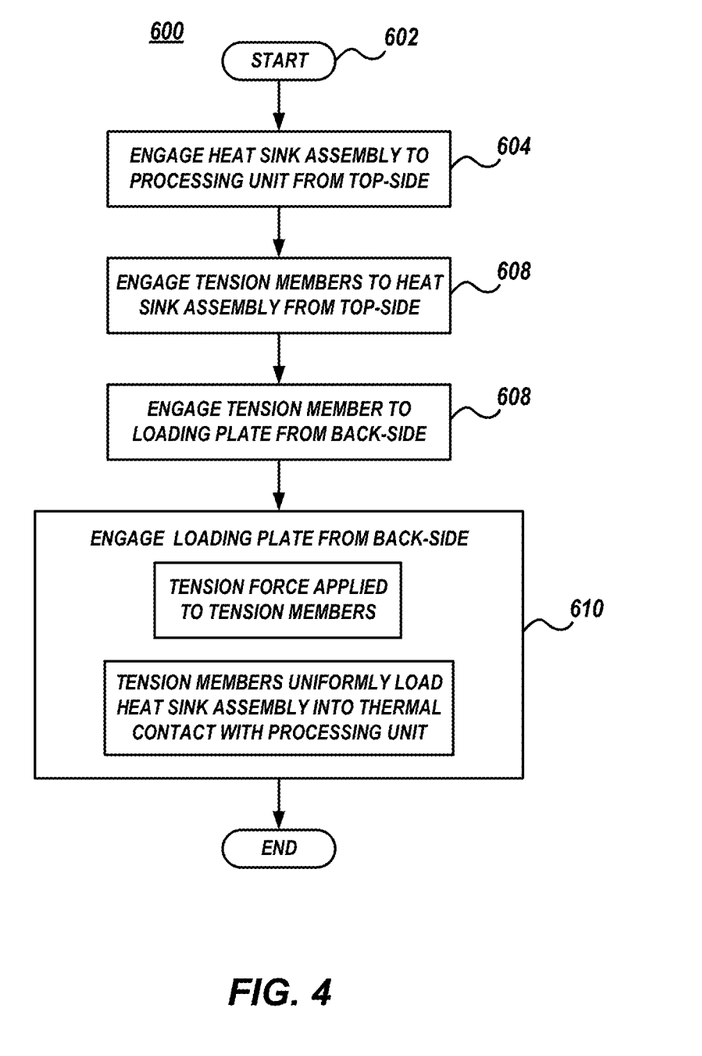
FIG. 4 depicts a method of uniform backside heat sink loading, according to various embodiments of the present invention.

FIG. 4 depicts a method 600 of uniform backside heat sink loading, according to various embodiments of the present invention. Method 600 begins at block 602 and continues with mounting, installing, or otherwise attaching heat sink assembly 100 to the processing unit 210 of the system board assembly 200 from the topside 20 (block 604).

Method 600 may continue by mounting, installing, or otherwise extending tension members 120 to heat sink assembly 100 from topside 20 so that the tension members 120 extend through system board assembly 200 (block 606). In other embodiments, tension members 120 are included within the heat sink assembly 100 (e.g. tension members 120 are connected to base 102, etc.). In these embodiments, the tension members 120 extend through system board assembly 200 upon the mounting of the heat sink assembly 100 to the processing unit 210 of the system board assembly 200 from the topside 20.

Method 600 may continue with engaging, installing, mounting, or otherwise connecting the loading plate 300 to the tension members 120 from the backside 40 (block 608). For example, the tension members 120 may align with and generally attach to tension member through-holes, or for example, tension members 120 may engage with key-hole through holes. In this manner subsequent to block 608, the loading plate 300 is generally connected to heat sink assembly 100 such that loading plate 300 and heat sink assembly 100 may move in the e.g. y-direction as a unit relative to e.g. system board assembly 200.

Method 600 may continue with rotating or otherwise engaging fastener 400 from backside 40 (block 610). The fastener 40 contacts the bottom surface of lower chassis 240. Further engagement of fastener 400 forces loading plate 300 away from the system board assembly 200. For example, loading plate 300 is forced away in the −y direction from the system board assembly 200. As a result, a tension force is placed upon tension members 120 that compress compression springs 108 to load heat sink assembly 100 into processing unit 210. In this manner, the backside 40 engagement of fastener 400 provides a uniform loading force to processing unit 210 such that pin grid array may seat or otherwise connect with the socket of system board assembly 200. The uniform loading also provides for thermal contact between the processing unit 210 and heat sink assembly 100 via thermal interface material 220. Method 600 ends at block 612.

References herein to terms such as vertical, horizontal, etc. are made by way of example, and not by way of limitation, to establish a frame of reference. Horizontal as contemplated herein is a plane parallel to the conventional plane or top surface of the system board 102, regardless of the actual spatial orientation of the electronic system. The term vertical refers to a direction perpendicular to the horizontal. Terms, such as "on", "above", "below", "side", "top", "bottom", "upper", "lower", "over", "beneath", "under", etc. are defined with respect to the horizontal plane. It is understood that various other frames of reference may be employed for describing the present invention without departing from the spirit and scope of the present invention.

The invention claimed is:

1. A backside initiated uniform heat sink loading system comprising:
   a system board assembly comprising at least a processing unit;
   a heat sink assembly mounted upon the processing unit from a topside of the system board assembly, the heat sink assembly comprising a base, a plurality of fins formed on the base, a plurality of tension members that extend through the system board assembly and through the base into the plurality of fins, and compressive springs mounted about each of the plurality of tension members on a topside of the base;
   a loading plate mounted to the plurality of tension members from a backside of the system board assembly, opposite the topside of the system board assembly; and
   a fastener that engages with the loading plate from a backside of the loading plate,
   wherein the compressive springs are located within the plurality of fins to be surrounded by the plurality of fins,
   wherein the fastener is structured to force the loading plate away from the system board assembly when it is engaged with the loading plate from the backside of the system board assembly,
   wherein the loading plate is a plate including stiffening features configured to prevent warpage or deflection of the loading plate, and
   wherein the loading plate includes a threaded clearance hole structured to engage with threads of the fastener to force the loading plate away from the system board assembly when the threads of the fastener are engaged with the threaded clearance hole of the loading plate from the backside of the loading plate.

2. The backside initiated uniform heat sink loading system of claim 1, wherein the plurality of tension members uniformly force the heat sink assembly upon the processing unit to seat the processing unit to the system board assembly.

3. The backside initiated uniform heat sink loading system of claim 1, wherein the plurality of tension members uniformly force a thermal contact between the heat sink assembly and the processing unit.

4. The backside initiated uniform heat sink loading system of claim 1, wherein each of the plurality of tension members comprise an upper flare portion that contacts an upper surface of an associated compressive spring of the compressive springs and an elongated portion that extends through the system board assembly and contacts the loading plate.

5. The backside initiated uniform heat sink loading system of claim 1, wherein the system board assembly further comprises a lower chassis directly connected to a bottom surface of a system board.

6. The backside initiated uniform heat sink loading system of claim 5, wherein the fastener contacts a bottom surface of the lower chassis to force the loading plate away from the system board assembly.

7. The backside initiated uniform heat sink loading system of claim 1, wherein the loading plate is configured to compress the compressive springs when the loading plate is forced away from the system board assembly to force the heat sink assembly into the processing unit to provide a uniform loading force to the processing unit.

8. An electronic system comprising:
   a system board assembly comprising at least a processing unit;
   a heat sink assembly mounted upon the processing unit from a topside of the system board assembly, the heat sink assembly comprising a base, a plurality of fins formed on a first area of the base, a plurality of tension members that extend through the system board assembly and through the base into the plurality of fins, and compressive springs mounted about each of the plurality of tension members on a topside of the base;
   a loading plate mounted to the plurality of tension members from a backside of the system board assembly, opposite the topside of the system board assembly;
   a fastener that engages with the loading plate from a backside of the loading plate; and
   a lower chassis directly connected to a bottom surface of the system board assembly,
   wherein the compressive springs are located on the first area of the base within the plurality of fins to be at least partially surrounded by the plurality of fins,
   wherein the fastener extends through a threaded clearance hole in the loading plate into contact with a bottom surface of the lower chassis to apply a uniform loading force to the processing unit, wherein the loading plate is a stiff plate including at least one of ribs or embosses to stiffen the loading plate configured to prevent warpage or deflection of the loading plate, and wherein the loading plate includes the threaded clearance hole structured to engage with threads of the fastener to force the loading plate away from the system board assembly when the threads of the fastener are engaged with the threaded clearance hole of the loading plate from the backside of the loading plate.

9. The electronic system of claim 8, wherein the fastener forces the loading plate away from the system board assembly.

10. The electronic system of claim 9, wherein the plurality of tension members uniformly force the heat sink assembly upon the processing unit to seat the processing unit to the system board assembly.

11. The electronic system of claim 9, wherein the plurality of tension members uniformly force a thermal contact between the heat sink assembly and the processing unit.

12. The electronic system of claim 8, wherein each of the tension members comprises an upper flare portion that contacts an upper surface of an associated compressive spring of the compressive springs and an elongated portion that extends through the system board assembly and contacts the loading plate.

13. The electronic system of claim 8, wherein the fastener contacts a bottom surface of the lower chassis to force the loading plate away from the system board assembly.

14. The electronic system of claim 8, wherein the loading plate is configured to compress the compressive springs when the loading plate is forced away from the system board assembly to force the heat sink assembly into the processing unit to provide a uniform loading force to the processing unit.

15. A uniform backside heat sink loading method comprising:

mounting a heat sink assembly to a processing unit from a topside of a system board assembly, wherein the heat sink assembly comprises a base, and a plurality of fins formed on a first area of the base;

installing a plurality of tension members through the heat sink assembly and through the system board assembly from the topside of the system board assembly, such that the plurality of tension members extends through the base into the plurality of fins, wherein each of the plurality of tension members includes a coiled compressive spring thereabout;

connecting a loading plate to the plurality of tension members from a backside of the system board assembly, opposite the topside of the system board assembly;

engaging a fastener to the loading plate from a backside of the loading plate to force the loading plate away from the system board assembly; and wherein the coiled compressive springs are located on the first area of the base within the plurality of fins to be at least partially surrounded by the plurality of fins, wherein the loading plate is a plate including stiffening features configured to prevent warpage or deflection of the loading plate, and wherein the loading plate includes a threaded clearance hole structured to engage with threads of the fastener to force the loading plate away from the system board assembly when the threads of the fastener are engaged with the threaded clearance hole of the loading plate from the backside of the loading plate.

16. The uniform backside heat sink loading method of claim 15, wherein engaging the fastener to the loading plate from the backside of the loading plate comprises:

contacting the fastener to a bottom surface of the system board assembly.

17. The uniform backside heat sink loading method of claim 15, wherein engaging the fastener to the loading plate from the backside of the loading plate comprises:

applying a tension force to the plurality of tension members to uniformity load the heat sink assembly into the processing unit.

18. The uniform backside heat sink loading method of claim 15, wherein engaging the fastener to the loading plate from the backside of the loading plate comprises:

thermally contacting the heat sink assembly with the processing unit.

19. The uniform backside heat sink loading method of claim 15, wherein engaging the fastener to the loading plate from the backside of the loading plate provides a uniform loading force to the processing unit.

20. The uniform backside heat sink loading method of claim 15, further comprising compressing the coiled compressive springs when the loading plate is forced away from the system board assembly to force the heat sink assembly into the processing unit to provide a uniform loading force to the processing unit.

* * * * *